May 27, 1969

JAMES E. WEBB
ADMINISTRATOR OF THE NATIONAL AERONAUTICS
AND SPACE ADMINISTRATION 3,446,676

SOLAR BATTERY WITH INTERCONNECTING MEANS FOR PLURAL CELLS

Filed Sept. 7, 1966

INVENTORS:
DONALD W. RITCHIE
JOHN V. GOLDSMITH

By [signature]
J. D. Warden
ATTORNEYS

United States Patent Office 3,446,676

Patented May 27, 1969

3,446,676

SOLAR BATTERY WITH INTERCONNECTING MEANS FOR PLURAL CELLS

James E. Webb, Administrator of the National Aeronautics and Space Administration, with respect to an invention of Donald W. Ritchie, Sepulveda, and John V. Goldsmith, Montrose, Calif.

Filed Sept. 7, 1966, Ser. No. 577,778
Int. Cl. H01l 15/04
U.S. Cl. 136—89 19 Claims

ABSTRACT OF THE DISCLOSURE

A large solar sensitive area for a solar battery is provided by grouping a plurality of individual solar cells in side by side juxtaposed relationship on a flat insulative substrate. Electrical conductive members include a plurality of tynes which project through the insulative substrate and are mechanically biased against the surface of the solar cells so as to hold them in place on the substrate. The tynes of each electrical conductive member are electrically connected to the solar cells they contact in order to form an electrical parallel circuit. Certain electrically conductive members are further electrically connected to additional solar cells so as to form series electrical circuits for the appropriate solar cells. The series electrical circuits provide required voltages from the solar battery; whereas, the parallel electrical circuits provide required electrical current from the solar battery.

The invention described herein was made in the performance of work under a NASA contract and is subject to the provisions of Section 305 of the National Aeronautics and Space Act of 1958, Public Law 85–568 (72 Stat. 435; 42 U.S.C. 2457).

This invention relates to apparatus which mechanically and electrically interconnects a multiplicity of solar cells for collectively forming a solar battery. More particularly, this invention relates to apparatus which mechanically connects a multiplicity of solar cells to a substrate and electrically interconnects the same multiplicity of solar cells into a series-parallel electrical connection for forming a solar battery.

Photovoltaics or solar cells are well known devices for converting light energy into electrical energy. A well known solar cell today is the silicon photovoltaic cell. The silicon solar cell includes a diffused p-type service layer (boron treated) superimposed on a thin n-type silicon wafer (usually 0.5 mm. in thickness).

In order to produce a substantial amount of usable electrical power from an array of solar cells, a relatively large area of the solar sensitive cells must be provided for the conversion of solar energy into electrical power. The provision of a large solar sensitive area is achieved by grouping a plurality of individual solar cells in a side-by-side juxtaposed relationship. Adequate usable electrical current is obtained from the plurality of individual solar cells by interconnecting the solar cells in an electrical parallel circuit. Adequate usable voltage is obtained from the plurality of individual solar cells by interconnecting the solar cells in an electrical series circuit. Solar cells thus electrically interconnected in an electrical parallel-series matrix, mechanically interconnected and arrayed so as to expose the solar sensitive cells to radiation from the sun form a solar battery.

Presently, one of the largest applications for photovoltaic or solar cells is in power supply sources for space vehicles. A solar electrical power supply source is most essential since alternative long life power sources are not available within the weight limitations imposed by the lifting capacity of known launching vehicles. A continuing requirement exists for improvements in a weight to output power ratio for solar cells utilized as power supply sources within space vehicles.

It is well known that temperature has a definite ascertainable effect on the electrical output of a conventional silicon solar cell battery. The electrical output of a silicon solar cell battery increases as temperature decreases. Thus, the electrical output from such a solar cell battery is greater at —100° F., for example, than at room temperature.

Since excessive non-productive materials previously utilized for the interconnection of solar cells in forming a solar battery not only add excessive weight and mass to the solar battery but also absorb and retain heat within the solar battery, the necessity has long existed for the elimination of such excessive non-productive materials from solar cells and from solar batteries.

Accordingly, an important object of this invention is to provide lightweight, rugged, durable electrical and mechanical connecting structure for electrically interconnecting a multiplicity of solar cells and mechanically attaching these solar cells to a lightweight substrate, and to each other, so as to form an effective and efficient solar battery.

Another object of this invention is to provide interconnecting structure for a plurality of solar cells which is simply constructed and easily adapted to solar cells for mechanically and electrically interconnecting a plurality of solar cells for forming a solar battery.

Another object of this invention is to provide interconnecting structure for a plurality of solar cells which facilitates greater flexibility in the array of solar cells than heretofore has been possible.

Another object of this invention is to provide interconnecting structure for a plurality of solar cells for producing a solar battery which completely eliminates the use of adhesive and other extraneous materials previously thought to be essential in the fabrication and array of a plurality of solar cells.

Another object of this invention is to provide interconnecting structure for solar cells which readily adapts itself to currently used automated soldering processes.

Another object of this invention is to provide interconnecting structure for solar cells which permits one or more defective solar cells to be easily unsoldered and disconnected from the array of solar cells without disturbing other solar cells within the solar battery.

That these and other objects and advantages of the invention are obtained will be better understood by referring to a preferred embodiment thereof as illustrated in the accompanying drawings, in which.

Figure 1:
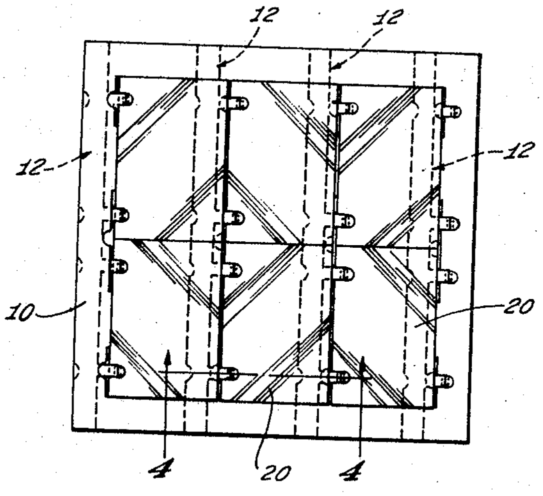
FIGURE 1 shows an array of a plurality of solar cells mechanically attached to a thin substrate and electrically interconnected in a parallel-series matrix by the interconnecting apparatus of this invention.
Figure 3:
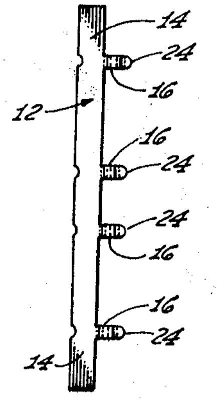
Figure 4:
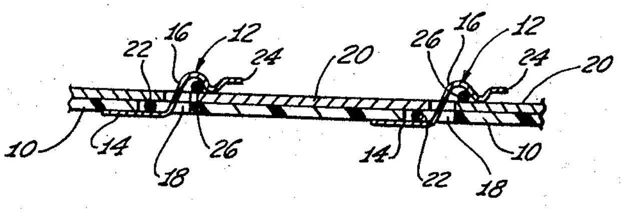

FIGURE 3 shows the interconnecting apparatus of this invention used for mechanically connecting a plurality of solar cells to a substrate and electrically interconnecting the same plurality of solar cells in a parallel-series matrix; and FIGURE 4 is a cross sectional side view taken on line 4—4 in FIGURE 1 showing three solar cells mechanically and electrically interconnected by the interconnecting apparatus of this invention.

Figure 2:
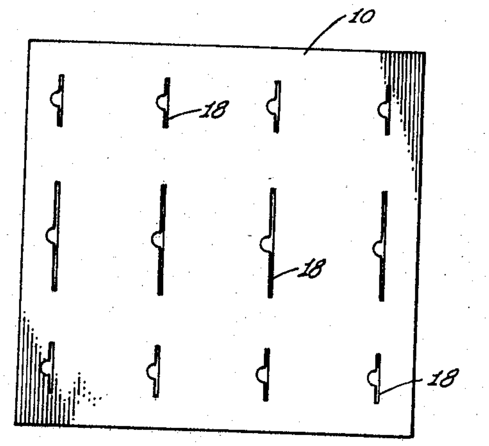
FIGURE 2 shows the thin film substrate with perforations therein for receiving mechanical and electrical interconnecting structure.

Referring to FIGURES 1 and 2, numeral 10 generally designates the substrate to which a plurality of solar cells are attached by the interconnecting apparatus of this invention. In order to reduce the weight normally associated with an array of solar cells so as to thereby improve the weight to output power ratio for the solar battery a very thin film substrate preferably is used. It has been found that a silicon cloth impregnated with silicon rubber or a fiber glass impregnated with epoxy resin may be used for the substrate. Also it is recognized that ordinary paper or a very thin plastic type material may be used. The substrate, which must be a dielectric insulator, may be as thin and lightweight as possible commensurate with the loading limitations imposed by the solar cells and the solar battery. The solar cells are mounted on the substrate 10 and mechanically and electrically interconnected by means of the interconnecting apparatus shown in FIGURES 1, 3 and 4.

Referring to FIGURE 3, the interconnecting apparatus of this invention is generally designated by the numeral 12. Although the interconnecting apparatus 12 may be made from various materials it has been found that gold plated copper provides good electrical conductivity, mechanical strength and flexibility. It is understood that the electrical and mechanical requirements for the interconnecting apparatus 12 will vary in accordance with specific application requirements for solar cells connected by this apparatus. Therefore, it is understood that the electrical and mechanical properties of the interconnecting apparatus 12 may be varied without limitations and still be within the purview of the scope and spirit of this invention.

Referring to FIGURES 1 and 3, and to FIGURE 3 in particular, it is seen that the interconnecting apparatus 12 is provided with a body member 14 and projecting clamping protrusions or tynes 16 extending from body member 14. It is understood that FIGURES 1 and 3 show an exemplification of one of many possible arrangements for tynes 16 on body member 14 and that the scope of this invention is not limited to the particular arrangement shown in FIGURES 1 and 3 since the physical orientation, number, size, configuration, dimensions and various other physical attributes of the interconnecting apparatus 12, shown in the drawings for exemplification solely, may be varied without limitation and still be within the scope and spirit of this invention. As seen in FIGURES 1 and 3, a single tyne 16 is provided at both the upper and lower ends of the interconnecting apparatus. Two additional tynes 16 are provided at the center of the body member 14. The two center tynes 16 are in close proximity with each other. This arrangement of tynes 16 on the body member 14 provides the interconnecting apparatus 12 with the capability of mechanically clamping and electrically interconnecting two or more individual solar cells so as to form a solar battery. When the interconnecting apparatus 12 is connected to the substrate 10 and the solar cells 20 the tynes 16 project through the perforations 18 provided in the substrate 10.

As can best be seen in FIGURES 1 and 4, the interconnecting apparatus 12 has its body member 14 positioned underneath the substrate 10 so that the member 14 may be soldered to the solar cells 20 by means of solder spots 22. Thus, substrate 10 is firmly held between member 14 and the solar cells 20 with member 14 being firmly attached to the solar cells 20 by the solder spots 22. The tynes 16 which project through the perforations 18 in substrate 10 are provided with a U-shaped configuration near their outermost extremity 24, as shown in FIGURE 4. In attaching a tyne 16 to an adjacently disposed solar cell the extremity 24 of the tyne may be grasped by hand or with an instrument and bent in a downward direction as seen in FIGURE 4 so that the tyne 16 makes contact with the top of an adjacently disposed solar cell 20. Also it is understood that the tynes 16 may be provided with a proper configuration prior to installation so that upon being extended through perforations 18 provided in substrate 10 the lower portions of the U-shaped configurations provided on the end extremities 24 of the tynes 16 contact the upper surface of an adjacently disposed solar cell 20 without further adjustment of the tynes. The tynes 16 may then be further attached to the solar cells 20 by means of solder spots 26, for example.

The interconnection of a multiplicity of solar cells by the interconnecting apparatus of this invention effectively lends itself to fabrication by automation. Not only is the interconnecting apparatus readily adaptable to hand soldering techniques, but a whole array of solar cells may be bonded to the interconnecting apparatus by means of a tunnel oven process, for example. In using a tunnel oven process solder pre-forms are placed at positions 22 and 26 as seen in FIGURE 4. A conveyor belt is then used to pass the structure to be soldered through an oven where the final soldering steps are completed. Thus the interconnecting apparatus is firmly bonded to the solar cells by this automated process thereby expeditiously and effectively fabricating a multiplicity of solar cells into a solar battery.

Referring to FIGURE 4, it is seen that as electrical energy is produced from solar energy by the solar cell 20, the electrical energy will flow from the solar cell through the solder bond 22 through the electrical conducting interconnecting apparatus 12, through solder bond 26 to the adjacent interconnected solar cell 20. Similiarly electrical energy flows between adjacent interconnected solar cells throughout the solar battery wherein the solar cells are interconnected by the interconnecting apparatus of this invention so as to produce an electrical parallel-series matrix.

When a solar cell requires replacement the spot weld attaching the solar cell to the interconnecting apparatus may be removed, the attaching tynes bent upward, the solar cell removed and another solar cell inserted in the position formerly occupied by the removed solar cell.

While a particular embodiment of this invention has been set forth herein for purposes of illustrating the invention concepts advanced by this invention, it is to be understood that the inventive concepts are not to be limited thereto but are to be limited only in accordance with the claims appended hereto.

What is claimed is:

1. A solar battery comprising a multiplicity of solar cells and a parallel-series electrical matrix for said solar cells, the improvement wherein said interconnecting apparatus comprises:

- an insulative substrate;
- a plurality of electrical conducting body members;
- a plurality of tynes projecting from each electrical conducting body member through openings in the substrate and adapted for mechanical contact against a plurality of solar cells to hold them in a side by side juxtaposed column relationship on said substrate;
- means electrically connecting said tynes of each electrical conducting body member to at least two or more solar cells in a column for forming parallel electrical circuits for each column; and
- means further electrically connecting selected electrical conducting body members to at least one solar cell of an adjacent column for forming series electrical circuits for the adjacent solar cell columns.

2. Interconnecting apparatus in accordance with claim 1 wherein a thin film substrate is superimposed on a portion of said electrical conducting body member, said substrate being provided with perforations so that said tynes may project through said substrate for contacting adjacently disposed solar cells.

3. Interconnecting apparatus in accordance with claim 2 wherein said substrate is a fiber glass impregnated with

4. Interconnecting apparatus in accordance with claim 2 wherein said substrate is a silicon cloth impregnated with silicon rubber.

5. Interconnecting apparatus in accordance with claim 2 wherein said substrate is a fiber glass impregnated with epoxy resin.

6. Interconnecting apparatus in accordance with claim 1 wherein said tynes are provided with a U-shaped configuration adjacent their outermost extremity so as to facilitate a good mechanical and electrical connection with a solar cell.

7. Interconnecting apparatus in accordance with claim 1 wherein said body member contacts the first of two adjacently disposed solar cells and one or more of said tynes project between the solar cells for contacting the second of the two adjacently disposed solar cells.

8. Interconnecting apparatus in accordance with claim 7 wherein said tyne mechanically and electrically contacts only one surface of one of two adjacently disposed solar cells.

9. Interconnecting apparatus in accordance with claim 7 wherein said means for connecting said one or more body member and said tynes to two or more solar cells consists of solar spots.

10. Interconnecting apparatus in accordance with claim 1 wherein said electrical conducting body member is provided with a tyne near each end extremity and two tynes in close proximity adjacent the center of said body member.

11. A solar battery comprising:

at least a first pair of solar cells positioned on an insulative substrate;

a first electrical conductive member having at least a pair of tynes projected through said substrate with one tyne each adapted for forceful contact against a solar cell of said first pair to mechanically hold said first cell pair in side by side relationship on said substrate;

means electrically connecting each tyne to the solar cell it contacts for forming a parallel electrical circuit for the solar cells of said first pair;

at least one additional solar cell positioned on said insulative substrate immediately adjacent said first electrical member; and means electrically connecting said additional cell to said first electrical conductive member for forming a series electrical circuit for said additional cell and said first pair of cells.

12. A solar battery in accordance with claim 11 and further comprising at least:

a second pair of solar cells mounted on said insulative substrate;

a second electrical conductive member separate from said first electrical conductive member and also having at least a pair of tynes projected through said substrate, with one tyne each adapted for forceful contact against a solar cell of said second pair to mechanically hold said second cell pair in side by side relationship on said substrate;

means electrically connecting each tyne of said second member to the solar cell it contacts for forming a parallel electrical circuit for said second pair of solar cells; and means further electrically connecting said second eletctrical conductive member to said first pair of solar cells for forming series electrical circuits for said first and said second pairs of solar cells.

13. A solar battery in accordance with claim 12 wherein said insulative substrate is a flat dielectric insulator sheet.

14. A solar battery in accordance with claim 13 wherein said substrate is a silicon cloth impregnated with silicon rubber.

15. A solar battery in accordance with claim 13 wherein said substrate is fiber glass impregnated with epoxy resin.

16. A solar battery in accordance with claim 13 wherein said tynes include horizontal portions spaced from said insulation sheet, which portions are provided with a U-shape configuration adjacent their outermost extremity so as to facilitate a good mechanical and electrical connection with a solar cell held in place against said sheet by said tynes.

17. A solar battery in accordance with claim 12 wherein said second electrical conductive member is positioned between adjacent solar cells of said first and second pairs and includes means for electrically connecting both of the adjacently disposed cells together in series at said second electrical conductive member.

18. A solar battery in accordance with claim 12 wherein said first and second electrical conductive members each comprise:

a flat elongated main body portion having the tynes integral therewith and extending vertically from a lengthwise edge thereof through said insulative substrate; and said tynes further characterized as having terminal portions bent over and spaced from the substrate a distance sufficient to mechanically secure a solar cell between the substrate and the terminal portion of the tynes.

19. A solar battery in accordance with claim 18 wherein the electrical connecting means for said additional cell comprises:

a solder spot between said main body portion of said first electrical conductive member and the surface of the additional cell disposed on the substrate.

No references cited.

ALLEN B. CURTIS, *Primary Examiner.*

U.S. Cl. X.R.

339—17